(12) United States Patent
Lin

(10) Patent No.: US 8,659,843 B2
(45) Date of Patent: Feb. 25, 2014

(54) APPARATUS FOR METHOD FOR IMMERSION LITHOGRAPHY

(75) Inventor: Burn-Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/176,587

(22) Filed: Jul. 5, 2011

(65) Prior Publication Data

US 2011/0261334 A1 Oct. 27, 2011

Related U.S. Application Data

(62) Division of application No. 11/292,383, filed on Dec. 1, 2005, now Pat. No. Re. 42,556, which is an application for the reissue of Pat. No. 6,788,477.

(51) Int. Cl.
*G02B 7/02* (2006.01)
*G02B 7/04* (2006.01)

(52) U.S. Cl.
CPC ........................................ *G02B 7/04* (2013.01)
USPC .......................................... 359/823; 359/822

(58) Field of Classification Search
USPC .......... 359/813, 814, 819, 820, 822, 823, 824
See application file for complete search history.

(56) References Cited

U.S. PATENT DOCUMENTS

| | | | |
|---|---|---|---|
| 3,648,587 A | 3/1972 | Stevens | |
| 4,057,347 A | 11/1977 | Moriyama et al. | |
| 4,480,910 A | 11/1984 | Takanashi et al. | |
| 4,509,852 A | 4/1985 | Tabarelli et al. | |
| 5,121,256 A | 6/1992 | Corle et al. | |
| 5,139,661 A | 8/1992 | Kolbert | |
| 5,541,995 A | 7/1996 | Normile et al. | |
| 6,191,429 B1 | 2/2001 | Suwa | |
| 6,788,477 B2 * | 9/2004 | Lin | ............................... 359/820 |
| 2001/0002315 A1 | 5/2001 | Schultz et al. | |

* cited by examiner

*Primary Examiner* — William Choi
(74) *Attorney, Agent, or Firm* — Slater & Matsil, L.L.P.

(57) ABSTRACT

An apparatus for immersion lithography that includes an imaging lens which has a front surface, a fluid-containing wafer stage for supporting a wafer that has a top surface to be exposed positioned spaced-apart and juxtaposed to the front surface of the imaging lens, and a fluid that has a refractive index between about 1.0 and about 2.0 filling a gap formed in-between the front surface of the imaging lens and the top surface of the wafer. A method for immersion lithography can be carried out by flowing a fluid through a gap formed in-between the front surface of an imaging lens and a top surface of a wafer. The flow rate and temperature of the fluid can be controlled while particulate contaminants are filtered out by a filtering device.

18 Claims, 2 Drawing Sheets

APPARATUS FOR METHOD FOR IMMERSION LITHOGRAPHY

This is a divisional reissue application, which claims the benefit of U.S. patent application Ser. No. 11/292,383, filed on Dec. 1, 2005, now U.S. Pat. No. RE. 42556 and entitled "Apparatus for Method for Immersion Lithography," which is a reissue patent and claims the benefit of and priority to U.S. patent application Ser. No. 10/278,962, filed on Oct. 22, 2002, and issued as U.S. Pat. No. 6,788,477 B2 and entitled "Apparatus for Method for Immersion Lithography," which disclosures are hereby incorporated by reference therein.

FIELD OF THE INVENTION

The present invention generally relates to apparatus and method for photolithography and more particularly, relates to apparatus and method for immersion lithography wherein a fluid fills a gap formed between an imaging lens and a wafer surface.

BACKGROUND OF THE INVENTION

The resolution of optical projections imaging is proportional to the imaging wavelength λ and inversely proportional to the numerical aperture (NA) of the imaging lens. The numerical aperture is the product of the refractive index n of the light propagation medium between the imaging lens and the image and sine of the half aperture angle of the imaging lens sin θ. Presently, λ is reduced to 193 nm and development work is ongoing for 153 nm while sin θ is approaching 0.9 in many roadmaps. To further reduce λ calls for vacuum and reflective optical systems such as in the case of 13.4 nm EUV imaging. Immersion lithography, which employs a high refractive index fluid between the last surface of the imaging device and the first surface on a wafer or substrate, offers a means to increase the numerical aperture and to reduce the wavelength without concern of the physical limitations.

Immersion microlithography is a known technique for improving the resolution in optical microscope. A drop of high index fluid is placed between the front surface of the microscopic objective lens and the observed sample. Immersion lithography also uses a high index fluid between the front surface (or the last surface) of the imaging lens and the first surface on a wafer or substrate. However, simply putting a drop of fluid between these two surfaces is not sufficient for modern projection mask aligner. Many manufacturing problems have to be overcome.

It is therefore an object of the present invention to provide an apparatus for immersion lithography that does not have the drawbacks or shortcomings of the conventional photolithography apparatus.

It is another object of the present invention to provide an apparatus for immersion lithography that does not have the photoresist outgassing problem.

It is a further object of the present invention to provide an apparatus for immersion lithography that does not have the wafer overheating problem.

It is another further object of the present invention to provide an apparatus for immersion lithography that does not have the particle contamination problem.

It is still another object of the present invention to provide an apparatus for immersion lithography that includes an imaging lens, a wafer and a fluid filling a gap formed between the imaging lens and the wafer.

It is yet another object of the present invention to provide an apparatus for immersion lithography wherein a fluid having a refractive index between about 1.0 and about 2.0 is used to fill a gap formed in-between an imaging lens and a wafer.

It is still another further object of the present invention to provide a method for conducting immersion lithography by flowing a fluid through a gap formed in-between an imaging lens and a wafer.

SUMMARY OF THE INVENTION

In accordance with the present invention, an apparatus and a method for immersion lithography are provided.

In accordance with an embodiment, a method comprises providing an imaging lens having a front surface, positioning a wafer having a top surface to be exposed, the top surface of the wafer positioned apart from the imaging lens front surface forming a gap. The method further comprises maintaining a fluid flowing through the gap and moving the wafer in a longitudinal direction for focusing.

In accordance with another embodiment, an apparatus comprises a lens having a front surface, a stage for supporting a wafer in an immersion fluid in which the front surface of the lens is disposed and a cover means.

In accordance with yet another embodiment, an apparatus comprises a lens having a front surface and a stage for supporting a wafer in an immersion fluid in which the front surface is disposed, wherein the stage is operable to move the wafer in a longitudinal direction for focusing.

In accordance with yet another embodiment, a stage comprises a holding means for supporting a wafer in a spaced apart relationship relative to a lens, forming a gap filled with immersion fluid and a circulating means for circulating the immersion fluid through the gap.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses an apparatus for immersion lithography which is constructed by three major components of an imaging lens that has a front surface, a wafer that has a top surface to be exposed positioned spaced-apart and juxtaposed to the front surface of the imaging lens, and a fluid that has a refractive index between about 1.0 and about 2.0 filling a gap formed in-between the front surface of the imaging lens and the top surface of the wafer.

The present invention further discloses a method for conducting immersion lithography by the operating steps of first providing an imaging lens that has a front surface, then positioning a wafer that has a top surface to be exposed spaced-apart and juxtaposed to the front surface of the imaging lens, and then flowing a fluid that has a refractive index between about 1.0 and about 2.0 through a gap formed in-between the front surface of the imaging lens and the top surface of the wafer.

The present invention uses a wafer stage that comprises fluid circulating and cleaning (or filtering) means to overcome the aforementioned problems. The fluid contacts the front surface (or last surface) of the imaging lens which is the imaging device in a projection mask aligner. It also contacts the top surface of the wafer which is usually coated with a layer of a photosensitive material. Optimally, an index matching layer may be coated over the photosensitive material layer providing the front surface. A protective layer coated over the photosensitive material layer may also provide the front surface.

The resolution and depth of focus (DOF) with immersion fluid as a function of λ and θ are governed by the following equations.

$$W = k_1 \cdot \lambda / \sin\theta \qquad \text{Equation 1}$$

$$DOF = k_3 \cdot \lambda / \sin^2(\theta/2), \quad \lambda = \lambda_0/n \qquad \text{Equation 2}$$

Where $\lambda$ is the wavelength in the immersion fluid. It is a product of the refractive index of the fluid and $\lambda_0$ is the corresponding wavelength in vacuum. By manipulating $\lambda$ and $\theta$, the improvement in resolution and DOF can be adjusted against each other. The following table shows three situations. The first situation uses the same lens aperture angle, improving resolution by the inverse of the refractive index 1.5, while DOF is also reduced by the same factor. The second situation maintains resolution while stretching DOF to the maximum. The third situation improves resolution and DOF together but neither is pushed to their full individual potential.

| N | $\sin\theta_0$ | $\sin\theta$ | W(immer)/ W(air) | DOF(immer)/ DOF(air) |
|---|---|---|---|---|
| 1.5 | 0.9 | 0.9 | 0.67 | 0.67 |
| 1.5 | 0.9 | 0.6 | 1 | 1.88 |
| 1.5 | 0.9 | 0.7 | 0.857 | 1.316 |

Figure 3:
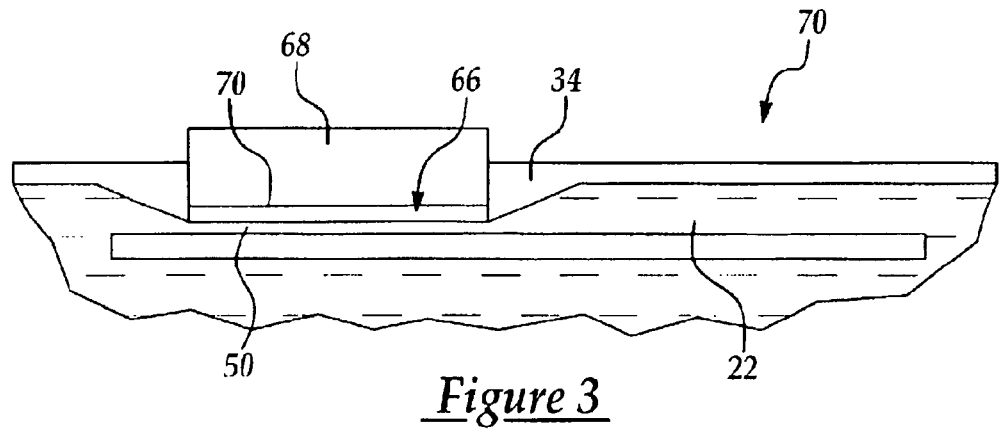
FIG. 3 is a cross-sectional view of an imaging lens for a third embodiment of the present invention apparatus.

Immersion can also be applied to proximity printing as shown in FIG. 3. In this case, there is no imaging lens. The mask serves its normal function and also as the imaging device. The immersion fluid has to contact the mutual facing surfaces of the mask and the wafer. In this case, the resolution and DOF relationship are related by Equation 3.

$$W^2/\lambda \cdot DOF \geq \text{printable Threshold} \qquad \text{Equation 3}$$

where printable threshold is generally taken as unity.

Figure 1A:
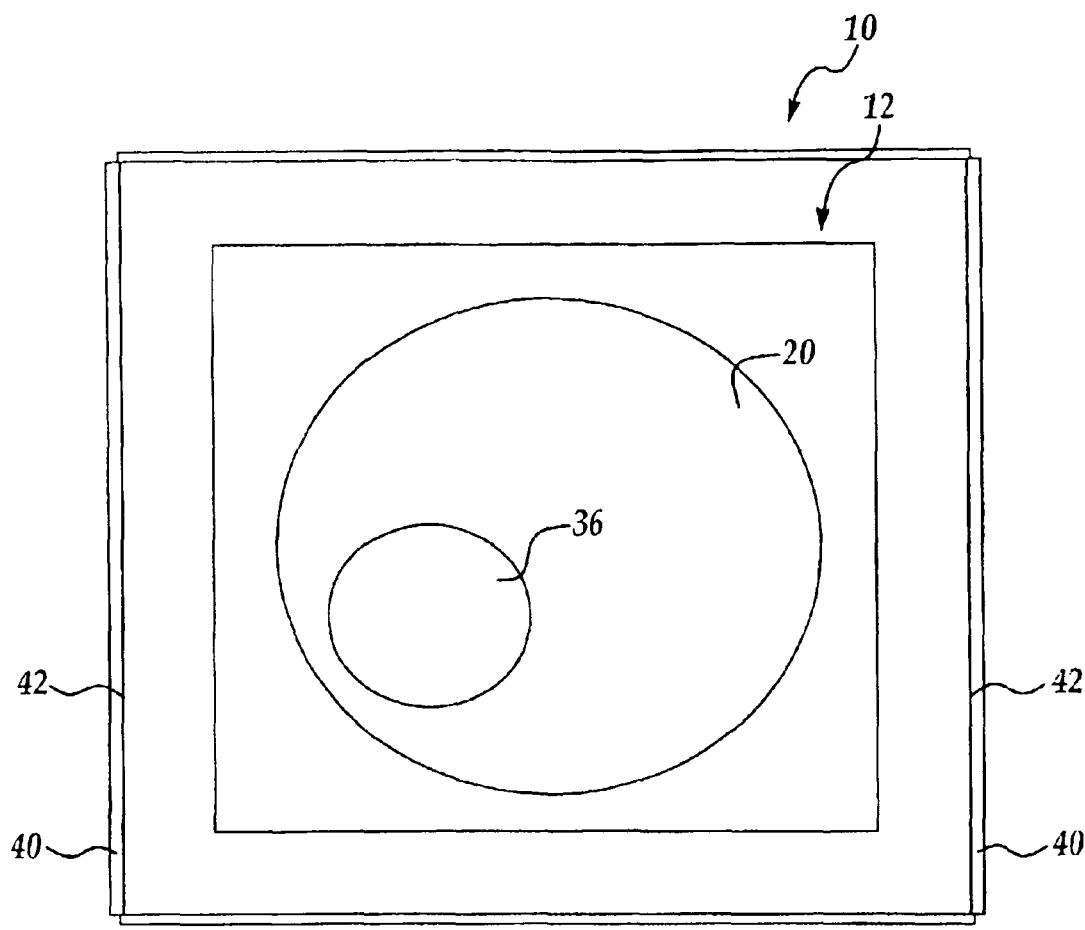
FIG. 1A is a top view of a preferred embodiment of the present invention apparatus for immersion lithography.
Figure 1B:
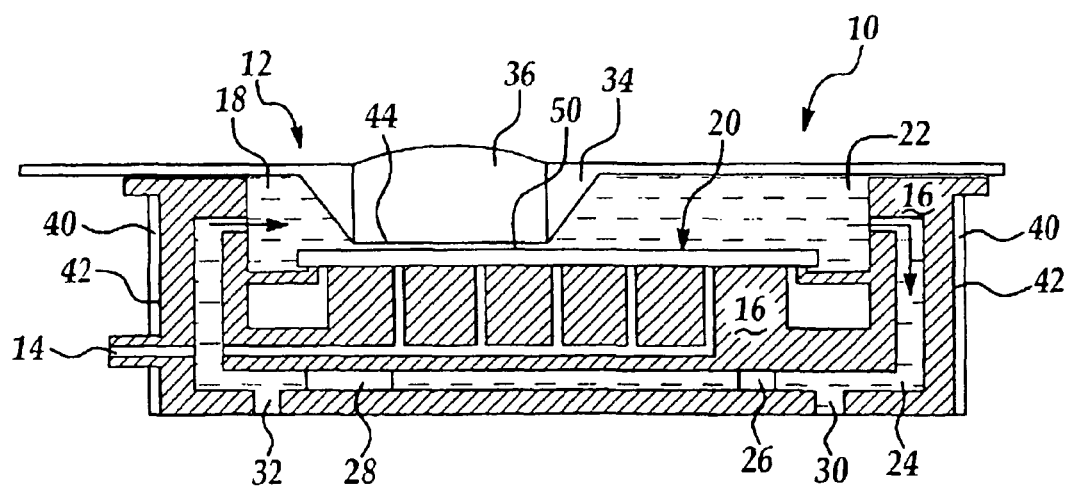
FIG. 1B is a cross-sectional view of the preferred embodiment of the present invention apparatus for immersion lithography shown in FIG. 1A.

Referring now to FIGS. 1A and 1B, wherein a top view and a cross-sectional view of a preferred embodiment of a present invention apparatus 10 are shown, respectively. The apparatus 10 consists mainly of a fluid-containing wafer stage 12 which includes vacuum means 14 for clamping wafer 20 to a wafer chuck 16. The fluid-containing wafer stage 12 further includes an internal cavity 18 for holding a predetermined quantity of fluid 22. A fluid passageway 24 is provided to allow fluid 22 to be delivered to and removed from the internal cavity 18. The passageway 24 further includes a filter means 26 and a pump means 28. The filter means 26 removes substantially particulates generated or introduced into the fluid 22 during operation of the exposure tool. The word "substantially" used in this writing indicates a percentage of at least 80%.

The internal cavity 18 is further equipped with an inlet 30 and an outlet 32 to facilitate the replenishment of new fluid and the discharging of used fluid, respectively. The fluid-containing wafer stage 12 further includes a cover means 34 and a flat lens element 36 having a flat front surface 44 to seal fluid 22 from the atmospheric environment. A mirror means 40 is attached on the sides 42 of the wafer stage 12 for the interferometric monitoring of the stage position. A wafer tilting means (not shown) may further be included in the fluid-containing wafer stage 12 to level the wafer. While structural details are not shown in the simplified drawings of FIGS. 1A and 1B, the wafer stage can be moved in the longitudinal direction for focusing, and in the lateral direction for repeated exposures and/or alignment to the mask.

In the present invention apparatus 10 shown in FIGS. 1A and 1B, the fluid 22 is circulated at a sufficient speed through the gap 50 formed in-between the imaging lens 36 and the wafer 20 in order to carry away gas bubbles, to keep the fluid 22 homogeneous, and to maintain the temperature of the immersing fluid 22. A temperature controlling means (not shown) is further provided for such purpose. Particulate contaminants are filtered out by the filter means 26 and are prevented from getting into the fluid 22 within the internal cavity 18. Any particulate contaminants generated from within or accidentally induced from outside are removed by the filter means 26. A pump means 28 is used to supply the pressure to circulate the fluid 22.

As the immersion fluid 22 inevitably absorbs light, it is desirable to keep the gap 50 between the front surface 44 of the lens 36 and the wafer 20 as small as possible in order to reduce unnecessary light absorption. For instance, it is desirable that gap 50 be kept at less than 5 mm, and preferably between 0.1 and 1 mm.

Figure 2:
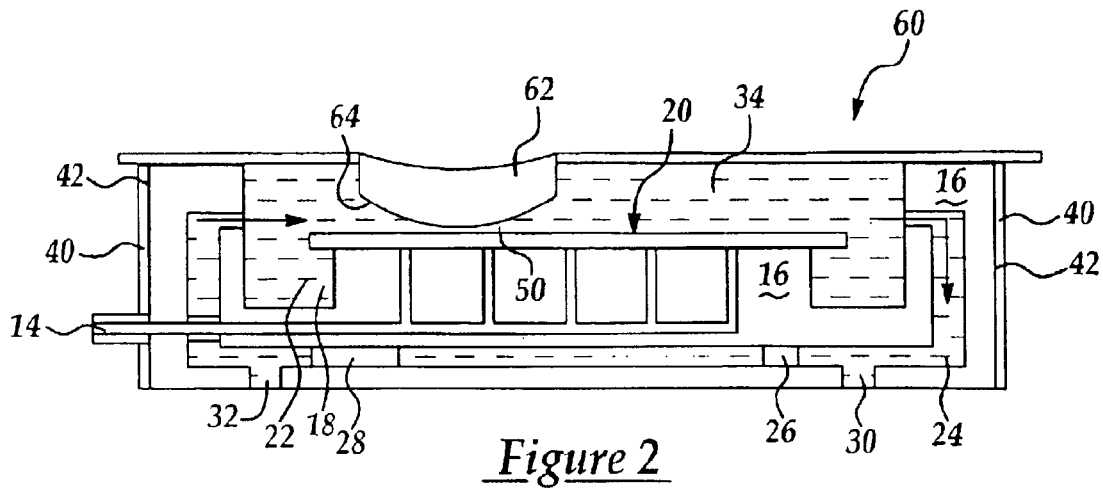
FIG. 2 is a cross-sectional view of a second embodiment of the present invention apparatus for immersion lithography.

A second embodiment 60 of the present invention apparatus for immersion lithography is shown in FIG. 2 in a cross-sectional view. In this second embodiment, a front lens element 62 having a front surface 64 is utilized for achieving a very thin gap 50 maintained between the lens 62 and the wafer 20. The other components in this second embodiment are substantially similar to that shown in the preferred embodiment of FIG. 1B.

A third embodiment 70 of the present invention apparatus for immersion lithography is shown in a simplified form in FIG. 3 in a cross-sectional view. The cover means 34 allows an increase of the thickness of the fluid 22 away from the lens surface in order to facilitate an improved fluid flow through gap 50. It should be noted that the configuration shown in FIG. 3 is that for a proximity printing apparatus wherein a photomask 66 is installed on the front surface 70 of mask holder 68.

Figure 4:
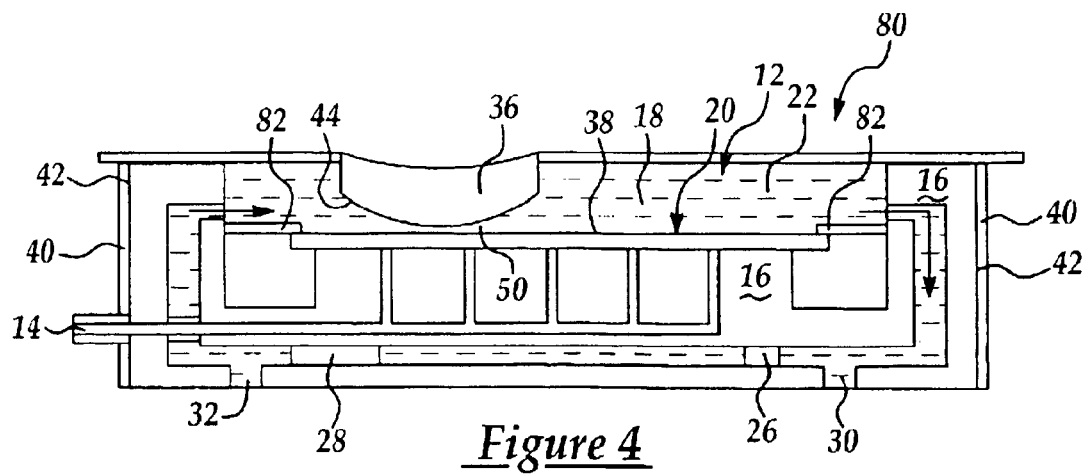
FIG. 4 is a cross-sectional view of the fourth embodiment of the present invention apparatus for immersion lithography.

In a fourth embodiment 80 of the present invention apparatus for immersion lithography, shown in FIG. 4 in a cross-sectional view, the wafer 20 is not completely submerged in the fluid 22. A fluid retaining means 82 is utilized to keep the fluid 22 between the front surface 44 of the imaging lens 36 and the top surface 38 of the wafer 20.

The present invention novel apparatus and method for immersion lithography have therefore been amply described in the above description and in the appended drawings of FIGS. 1A-4.

While the present invention has been described in an illustrative manner, it should be understood that the terminology used is intended to be in a nature of words of description rather than of limitation.

Furthermore, while the present invention has been described in terms of one preferred and three alternate embodiments, it is to be appreciated that those skilled in the art will readily apply these teachings to other possible variations of the inventions.

The embodiment of the invention in which an exclusive property or privilege is claimed are defined as follows.

What is claimed is:

1. A method comprising:
providing an imaging lens having a front surface;
positioning a wafer having a top surface to be exposed, the top surface of the wafer positioned apart from the imaging lens front surface forming a gap therebetween, wherein the wafer is in a wafer stage comprising a chuck for holding the wafer, a circulating passageway for circulating a fluid within the wafer stage;
maintaining a fluid flowing through the gap; and
moving the wafer in a longitudinal direction for focusing.

2. The method of claim 1, wherein the gap is 5 mm or less.

3. The method of claim 1, further comprising moving the wafer in a lateral direction for repeated exposures.

4. The method of claim 1, further comprising completely submerging the wafer in the fluid.

5. The method of claim 1, further comprising inducing the fluid to flow through the gap.

6. The method of claim 1, further comprising filtering the fluid.

7. An apparatus comprising:
a lens having a front surface;
a stage for supporting a wafer in an immersion fluid in which the front surface of the lens is disposed, wherein the stage is operable to move longitudinally for focusing, wherein the stage comprises a chuck for holding the wafer and a circulating passageway for circulating a fluid within the stage; and
a cover means.

8. The apparatus of claim 7, wherein the stage is operable to move laterally for repeated exposures.

9. The apparatus of claim 7, further comprising a vacuum means for clamping the wafer to a wafer chuck.

10. The apparatus of claim 7, further comprising a minor means for monitoring a position of the lens relative to the wafer.

11. An apparatus comprising:
a lens having a front surface; and
a stage for supporting a wafer in an immersion fluid in which the front surface is disposed, wherein the stage is operable to move the wafer in a longitudinal direction for focusing, and wherein the stage comprises a chuck for holding the wafer and a circulating passageway for circulating the immersion fluid within the stage.

12. The apparatus of claim 11, further comprising a minor means for monitoring a position of the lens relative to the wafer.

13. The apparatus of claim 11, further comprising a fluid circulation means.

14. The apparatus of claim 11, further comprising a vacuum means.

15. A stage comprising:
a holding means for supporting a wafer in a spaced apart relationship relative to a lens, forming a gap filled with immersion fluid there between;
a fluid retaining means for maintaining the fluid in the gap between the lens and the wafer when the wafer is not completely submerged in the fluid; and
a circulating means for circulating the immersion fluid through the gap, wherein the fluid is circulated within the stage.

16. The stage of claim 15, wherein the stage forms a cavity for containing the immersion fluid.

17. The stage of claim 15, wherein the stage is operable to move longitudinally for focusing.

18. The stage of claim 15, wherein the stage is operable to move laterally for repeated exposures.

* * * * *